United States Patent [19]
Ishigaki et al.

[11] 3,980,900
[45] Sept. 14, 1976

[54] MULTIPURPOSE SWITCHING CIRCUITS UTILIZING A NOVEL SEMICONDUCTOR DEVICE

[75] Inventors: Yoshio Ishigaki, Tokyo; Takashi Okada, Yokohama, both of Japan

[73] Assignee: Sony Corporation, Tokyo, Japan

[22] Filed: Mar. 26, 1975

[21] Appl. No.: 562,176

[30] Foreign Application Priority Data
Apr. 2, 1974 Japan.............................. 49-37118

[52] U.S. Cl.............................. 307/243; 307/254; 307/303; 329/103; 357/33; 357/34; 357/89
[51] Int. Cl.² .................. H03K 17/66; H01L 29/50
[58] Field of Search ........... 307/DIG. 3, 235 T, 264, 307/241, 242, 249, 254, 303, 243; 330/29, 30 D; 328/169, 171, 172; 357/14, 90, 33, 34, 89; 329/50, 103

[56] References Cited
UNITED STATES PATENTS

| | | | |
|---|---|---|---|
| 2,862,171 | 11/1958 | Freeborn | 307/317 |
| 3,660,679 | 5/1972 | Ishigaki et al. | 330/30 D |
| 3,772,097 | 11/1973 | Davis | 357/14 |

Primary Examiner—John Zazworsky
Assistant Examiner—Marcus S. Rasco
Attorney, Agent, or Firm—Hill, Gross, Simpson, Van Santen, Steadman, Chiara & Simpson

[57] ABSTRACT

A multipurpose switching circuit of the balanced type constituting a pair of switching paths each formed by first and second transistors connected in series and supplied with an input signal and a switching signal, respectively, and a novel semiconductor device of the three-terminal type with first and third terminals connected to both of the pair of switching paths, respectively, and a second terminal connected to an output terminal of the circuit. The respective second transistors of both the paths cause the switching operation to alternate in accordance with the switching signal, and both the input signals supplied to the respective first transistors of the pair of switching paths are alternately switched to the output terminal through the novel semiconductor device in response to the switching operation of the first transistors. The novel semiconductor device has a semiconductor body similar to an ordinary transistor and acts as a bidirectionally conductive element with superior symmetrical characteristics.

11 Claims, 4 Drawing Figures

MULTIPURPOSE SWITCHING CIRCUITS UTILIZING A NOVEL SEMICONDUCTOR DEVICE

BACKGROUND OF THE INVENTION

1. Field of the Invention

This invention relates generally to multipurpose switching circuits used, for example, to from a synchronous detector, and more particularly to solid state multipurpose switching circuits employing a novel semiconductor device of the three-terminal type with a superior symmetrical characteristic.

2. Description of the Prior Art

Several types of multipurpose switching circuits have been proposed for use as, for example, a synchronous detector such as a color demodulator for demodulatng a chrominance signal of a composite color television signal which is amplitude-modulated on a modulation axis of a predetermined phase. In such circuits, at least one switching element is provided and a first signal which is to be switched is applied to an input terminal connected to the switching element. The switching element is supplied with a second signal and controls the switching operation in accordance with the second signal so as to transmit the first signal to an output terminal intermittently during its conductive or non-conductive state, thereby to produce the switched first signal which is switched in synchromism with the second signal.

There has further been a multipurpose switching circuit of a different type which has a couple of input terminals and at least one single output terminal connected to a switching element to derive at the output terminal a composite of the first and second signals respectively applied to both input terminals alternatively in accordance with a third signal. The third signal is supplied to the switching element to control the switching operation.

Such multipurpose switching circuits as described above are usually constructed in the form of a balanced type, that is, a pair of signal transmitting paths including a switching element are symmetrically provided with a common output terminal and alternately switched by a switching signal, so as to avoid a change in the D.C. level of the output signal which tends to occur in response to the switching operation of the switching element. Accordingly the circuits usually require a number of elements performing the switching or ON-OFF operation and moreover are relatively complicated in structure.

SUMMARY OF THE INVENTION

It is an object of the present invention to provide a multipurpose switching circuit of the balanced type which requires a decreased number of elements performing the switching or ON-OFF operation by means of utilization of a novel semiconductor device.

Another object of the present invention is to provide a multipurpose switching circuit having a novel and simplified balanced structure formed with a novel semiconductor device.

Another object of the present invention is to provide a multipurpose switching circuit of the balanced type providing a superior symmetrical characteristic notwithstanding its simple structure which results from utilization of a novel semiconductor device which acts as a switching device with symmetrically bidirectional conductivity.

This invention provides a multipurpose switching circuit of the balanced type having a pair of switching paths connected to a pair of input terminals, in which a novel semiconductor device is connected between both switching paths and an output terminal to transmit signals applied respectively to both of the switching paths alternately in accordance with the switching operation of the switching path. The novel semiconductor device is constructed as a three-terminal device with a semiconductor body similar to an ordinary transistor and able to perform the switching or amplifying operation like the ordinary transistor. One the distinctive features of the novel semiconductor device is its bidirectional conductivity and superior symmetrical characteristic. This feature is mainly utilized in the multipurpose circuit according to the present invention.

Other objects, features and advantages of the present invention will become apparent from the following description taken in conjunction with the accompanying drawings.

DESCRIPTION OF THE PREFERRED EMBODIMENTS

Figure 1:
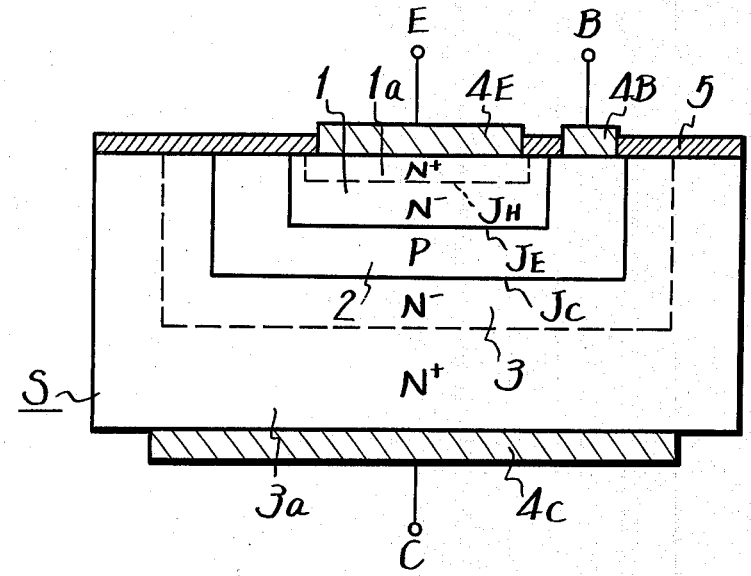
FIGS. 1 and 2 are cross-sectional views each showing an example of a semiconductor element which is usable in the present invention.

Before describing the present invention, an embodiment of the novel semiconductor device usable in the invention will be now described.

The emitter-grounded current amplification factor $h_{FE}$ of a transistor, which is one of the parameters for evaluating the characteristics of the bipolar transistor, can be expressed by the following equation (1), if the base-grounded current amplification factor of the transistor is taken as $\alpha$.

$$h_{FE} = \frac{\alpha}{1-\alpha} \quad (1)$$

The factor $\alpha$ is expressed as follows:

$$\alpha = \alpha^* \beta \gamma \quad (2)$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \quad (3)$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \tag{4}$$

$$J_p = \frac{qD_p p_n}{L_p} \left\{ \exp\left(\frac{qV}{kT}\right) - 1 \right\} \tag{5}$$

the ratio $\delta$ of $J_n$ and $J_p$ is expressed as follows:

$$\delta = \frac{J_p}{J_n} = \frac{L_n}{L_p} \cdot \frac{D_p}{D_n} \cdot \frac{p_n}{n_p} \tag{6}$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; $V$ a voltage applied to the emitter junction of the transistor; k the Boltzmann's constant; and $T$ temperature.

If it is assumed that the impurity concentration in the emitter of the transistor is taken as $N_D$ and that in the base of the transistor taken as $N_A$, the term P$n$/$n$P can be replaced by the term $N_A/N_D$. Further, since $L_n$ is restricted by the base width W and $L_n = W$, the ratio $\delta$ is expressed as follows:

$$\delta = \frac{W}{L_p} \cdot \frac{D_p}{D_n} \cdot \frac{N_A}{N_D} \tag{7}$$

The diffusion constants $D_n$ and $D_p$ are functions of transfer of the carrier and temperature and in this case they are assumed substantially constant.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atom/cm$^3$, lattice defects and dislocation occur in the crystal of the semiconductor body of the transistor which deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \tag{8}$$

the diffusion distance $L_p$ of the minority carriers or holes becomes short. Therefore, as may be apparent from the equation (7), $\delta$ can not be made very small and hence the injection efficiency $\gamma$ can not exceed a certain value. As a result, the current amplification factor $h_{FE}$ can not be made very high in the ordinary transistor.

As mentioned previously, the novel semiconductor device usable in this invention is free from the defects mentioned above which are inherent to the prior art transistor. For the semiconductor device used in this invention, either an NPN-type or a PNP-type could be discussed, as in the case of the prior art transistor. An NPN-type semiconductor device usable in this invention will be now described with reference to FIGS. 1 and 2, by way of example.

As shown in FIG. 1, the NPN-type semiconductor device consists of a first semiconductor region 1 of N$^-$ type conductivity formed in a semiconductor substrate S of N$^+$ type conductivity, a second semiconductor region 2 of P type conductivity formed in the semiconductor substrate S adjacent the first region 1, and a third semiconductor region 3 of N$^-$ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device usable in this invention and shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, or at least heat energy is formed in the first region 1. In the example of FIG. 1, the impurity concentration in the first region 1 is selected sufficiently low such as in the order of $10^{15}$ atom/cm$^3$ and region 1$a$ of N$^+$ type conductivity or the impurity concentration of about $10^{19}$ atom/cm$^3$ is formed in the first region 1 to form an LH-junction (low-high impurity concentration junction) and hence to form the barrier.

The impurity concentration in the second region 2 is selected in the order of $10^{15} - 10^{17}$ atom/cm$^3$ and in the third region 3 is selected sufficiently low such as in the order of $10^{15}$ atom/cm$^3$.

In the semiconductor substrate S adjacent to the third region 3 but apart from the second junction $J_c$, there is formed a region 3$a$ of N$^+$ type conductivity and with the impurity concentration of about $10^{19}$ atom/cm$^3$.

A first electrode 4E is formed on the high impurity concentration region 1$a$ in the region 1 in ohmic contact therewith; a second electrode 4B is formed on the second region 2 in ohmic contact therewith; and a third electrode 4C on the high impurity concentration region 3$a$ adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, SiO$_2$ formed on the surface of the substrate S.

The semiconductor device shown in FIG. 1 can be used as a transistor. In such a case, the first region 1 serves as an emitter region; the second region 2 as a base region; and the third region 3 as a collector region, respectively. A forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has the low inpurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is long, the injected holes into the emitter region 1 may arrive at the surface of the substrate S and may be recombined with electrons on the surface in practice, thus shortening the diffusion distance $L_p$. With the semiconductor device shown in FIG. 1, since the potential barrier is formed in the emitter region 1, which potential barrier faces a emitter junction $J_E$, at the position with a distance smaller than the diffusion distance $L_p$ of the minority carrier, the amount of the surface-recombination is reduced and the diffusion distance $L_p$ can be made sufficiently long.

Due to the fact that the potential barrier is formed as described above in the example shown in FIG. 1, there is created such an effect that the current density or component $J_p$ of the holes injected from the base region 2 to the emitter region 1 is reduced. That is, on the LH-junction $J_H$ in the emitter region 1, there results a false Fermi level difference or built-in electric field which acts to suppress the diffusion of the holes or the minority carrier. Therefore, if the level of the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of the holes or at least the heat energy. The heat energy can be approximated as $kT$ but the above level difference is desired to be more than 0.1 eV. Within the transition region of the potential, the diffusion distance $L_p$ of the holes must not terminate within the transition region, or it is required that the diffusion distance $L_p$ of the hole must be greater than the width of the transition region.

In the case that LH-junction $J_H$ is formed as shown in FIG. 1, the potential barrier of 0.2 eV can be formed by suitably selecting the amount of impurity and gradient of the high impurity concentration region $1a$.

Figure 2:
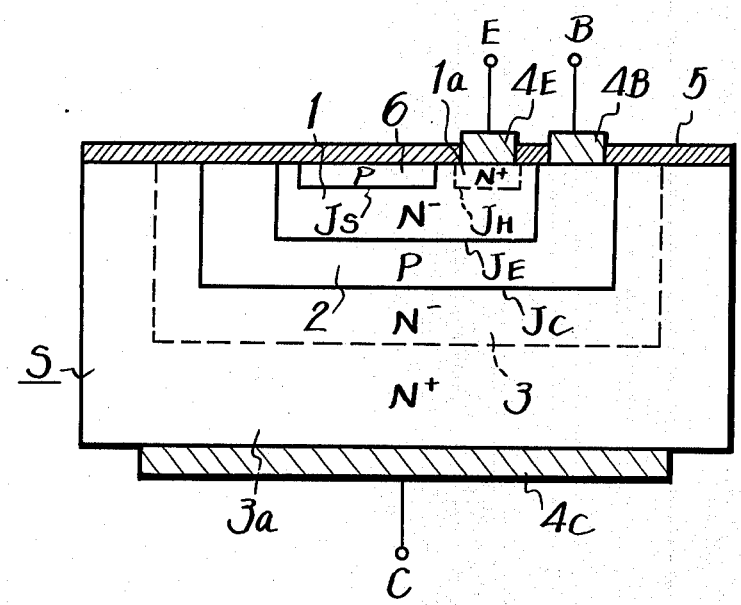

FIG. 2 shows another example of the semiconductor device useable with the invention in which reference numerals and letters same as those used in FIG. 1 indicate the same device so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from an electrical point of view, its potential is increased as the number of holes arriving at the additional region 6 is increased. Thus, the PN junction $J_S$ formed between the regions 6 and 1 is forward biased to its rising-up voltage, and then holes will be re-injected to the first region 1 from the additional region 6. Thus, the concentration of holes in the first region 1 near the additional region 6 will be increased, and accordingly the concentration distribution of holes between the junctions $J_E$ and $J_S$ in the first region 1 is made uniform and the gradient thereof becomes gradual to reduce the diffusion current $J_p$ from the second region 2 to the first region 1.

In the example of FIG. 2, the additional region 6 which has the same conductivity type as that of the second region 2 is formed in the first region 1 separated from the second region 2, but it may be possible that the second region 6 is formed as a continuous extension from the second region 2.

The above description relates to the situation in which the first, second and third regions 1, 2 and 3 of the semiconductor elements are operated as emitter, base and collector, respectively. However, in the above semiconductor devices impurity concentrations of the first and third regions 1 and 3 surrounding the second region 2 are selected low and of about equal order and they are arranged symmetrically with respect to the second region 2, so that if the first, second and third regions 1, 2 and 3 are used as, collector, base and emitter, respectively, the semiconductor devices can be operated as a transistor which is in reverse to the operating direction as mentioned previously.

When the symmetry of the semiconductor devices is utilized, the symmetry can be emphasized by forming in the third region 3 a potential barrier facing the second junction $J_C$, surrounding the same and having the energy higher than that of the minority carrier or hole in the third region 3 as shown in FIGS. 1 and 2 by dotted lines outside the junction $J_C$. To this end, the region $3a$ of high impurity concentration in the third region 3 is so formed to surround the junction $J_C$ and the distance between the junction $J_C$ and the region $3a$ is selected smaller than the diffusion distance of the minority carrier or hole injected to the third region 3 at the respective parts.

The features of the novel semiconductor devices described above can be summarized as follows which will be apparent from the above description.

1. The current amplification factor $h_{FE}$ is high and can be increased to more than 3000.

2. The current amplification factor $h_{FE}$ is uniform. That is, with a prior art transistor, the impurity concentration of the emitter region is selected sufficiently high so as to increase the emitter injection efficiency or the current amplification factor of the prior art transistor depending upon the difference of the impurity concentrations near the junction between the emitter and base regions, so that it is required to select the impurity concentrations in both the regions relative to one another. On the contrary, in the semiconductor devices for use with the invention, by forming the potential barrier in the emitter region 1 facing the emitter junction $J_E$, the current component of the minority carrier injected in the emitter region 1 is suppressed to increase the emitter injection efficiency, so that the mutual influence between the emitter and base regions 1 and 2 is small due to the fact that the emitter region 1 is selected relatively low in impurity concentration. Therefore, the width of the base region 2 and the distribution of impurity concentration therein can be selected as planned and hence $h_{FE}$ can be uniform as described above.

3. Since the effect of the surface recombination is avoided, the current amplification factor $h_{FE}$ can be made high even if the current is low.

4. The noise can be reduced. That is, since the main parts of the first and second junctions $J_E$ and $J_C$ are formed between the low impurity concentration regions of P and N conductivity types, crystal defects are small. Further, if the impurity concentration near the electrode 4B attached to the second region 2, by way of example, is selected high, a component of the transister emitter-base current, along the surface of the semiconductor substrate S can be reduced. Therefore, the noise of $1/f$ can be reduced. Further, the burst noise and noise of $1/f$ can be also reduced by the fact that $h_{FE}$ is high. In addition, if a base expansion resistance $\gamma_{bb}'$ is made small, the noise can be reduced even if the impedance of a signal source is low.

5. The current amplification factor $h_{FE}$ has good temperature characteristics.

6. The semiconductor devices can be used as bidirectionally conductive transistors, respectively, and are excellent in symmetry.

7. Since the impurity concentration in the vicinity of the first and second junctions $J_E$ and $J_C$ is low, $BV_{BEO}$ (collector-opened base-emitter voltage) is high for both the forward and reverse directions of transistors.

8. When the semiconductor devices are used as a power transistor, their power capability is high because their emission is made uniform by their distributed inner resistance in their emitter region.

9. Saturation characteristics are superior.

10. When the region 6, which carrier out injection or reinjection, is formed, the equivalent resistance of the base is lowered.

The invention relies upon the fact that the above novel semiconductor device has a body structure symmetrical with respect to the second region 2, and provides a novel multipurpose switching circuit which is good in balance and small in number of elements used therein by employing the above novel semiconductor device.

Figure 3:
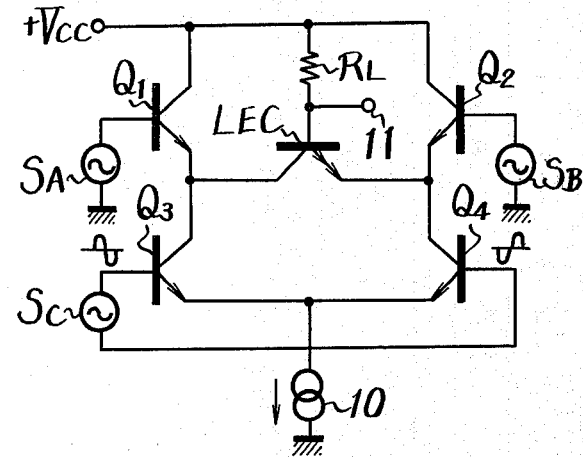
FIG. 3 is a schematic circuit diagram showing an embodiment of multipurpose switching circuits according to the present invention.
Figure 4:
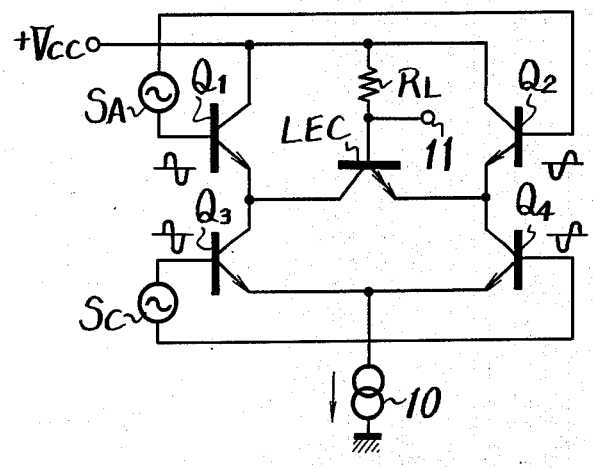
FIG. 4 is a schematic circuit diagram showing another embodiment of multipurpose switching circuits according to the present invention.

The circuit according to this invention uses the above described novel semiconductor device (Low Emitter concentration transistor) LEC and first to fourth transistor elements $Q_1$ to $Q_4$, as shown in FIGS. 3 and 4. As the first to fourth transistor elements $Q_1$ to $Q_4$, an ordinary transistor, or the novel semiconductor device or a field effect transistor (FET) may be used. In the embodiment of the invention shown in FIG. 3, an ordinary transistor of NPN-type is used as the first to fourth transistor elements $Q_1$ to $Q_4$, respectively.

In the embodiment of FIG. 3, the collectors of the first and second input transistors $Q_1$ and $Q_2$ are connected together to a voltage source terminal $+V_{cc}$, the base of the transistor $Q_1$ is connected to a signal source $S_A$, and the base of the transistor $Q_2$ is connected to a signal source $S_B$. The emitters of the input transistors $Q_1$ and $Q_2$ are connected to a third electrode or collector and a first electrode or emitter of the semiconductor device LEC, respectively, and also to the collectors of the third and fourth switching transistors $Q_3$ and $Q_4$, respectively. The emitters of the switching transistors $Q_3$ and $Q_4$ are connected together to a common constant current sink 10. A signal source $S_C$ is connected differentially to the bases of the switching transistors $Q_3$ and $Q_4$ to permit them to carry out switching operations differentially. A load resistor $R_L$ is connected between the voltage source $+V_{cc}$ and a second electrode or base of the semiconductor device LEC, and an output terminal 11 is led out from the base of the semiconductor device LEC.

With the circuit shown in FIG. 3, when the transistor $Q_3$ is made ON by the signal source $S_C$ and the transistor $Q_4$ is made OFF by the signal source $S_C$, the emitter of the transistor $Q_1$ and the collector of the semiconductor element LEC are connected through the transistor $Q_3$ to the constant current sink 10 to form a first current path, while the emitters of the transistor $Q_2$ and the semiconductor device LEC are opened or disconnected from the constant current sink 10. Therefore, at this time a signal according to the signal source $S_A$ appears at the emitter of the transistor $Q_1$ and then is delivered through the collector-base junction of the semiconductor device LEC to the output terminal 11. Next, when the transistor $Q_3$ is made OFF but the transistor $Q_4$ is made ON by the signal source $S_C$, the emitter currents of $Q_2$ flow along a second current path to the constant current sink 10, and a signal according to the signal source $S_B$ appears at the emitter of the transistor $Q_2$ and is then delivered through the emitter-base junction of the semiconductor device LEC to the output terminal 11. The above operation will be repeated, and at the output terminal 11 there will appear signals according to the signal sources $S_A$ and $S_B$ in response to the conduction of the transistors $Q_3$ and $Q_4$.

The switching circuit according to this invention is good in linearity. Further, by employing the semiconductor device LEC, the diode characteristics of its base-emitter junction and base-collector junction can be easily made the same, so that the symmetric balance of the switching circuit can be improved, and accordingly the DC potential at the output terminal 11 is prevented from being fluctuated upon signal switching and a so-called pedestal level shift is avoided. Therefore, the switching circuit of the invention can be directly connected to a subsequent circuit to supply the output signal thereto without any accompanying transient noise. In addition, since $BV_{BEO}$ of the semiconductor device LEC is high, the magnitude of the output obtained at the output terminal 11 can be made large.

FIG. 4 shows an embodiment in which the switching circuit of this invention is applied to a phase detector circuit. In the embodiment of FIG. 4, the bases of the transistors $Q_1$ and $Q_2$ are differentially supplied with a signal from the signal source $S_A$ such, for example, as a chrominance signal in a color television signal, and as the signal source $S_C$, a reference carrier signal source for demodulation of the chrominance signal is used. Further, a low pass filter (not shown) is provided at the output terminal 11.

With the embodiment shown in FIG. 4, a phase-detected output signal of a DC level determined in response to the phase difference between the chrominance signal and the reference carrier signal can be obtained.

Since the semiconductor device LEC of this invention is a type of transistor which symmetrical with respect to the base, the connections of its collector and emitter can be exchanged.

We claim as our invention:

1. A switching circuit comprising;
   a. first and second current paths each formed with switching means and signal input means connected to said switching means,
   b. a current sink connected in common to both said first and second current paths, c. means for supplying a switching signal to both said switching means of the first and second current paths to cause them to switch alternately, d. a semiconductor device comprising a first semiconductor region of one type, a second semiconductor region of the other type adjacent said first region with a first semiconductor junction therebetween, a third semiconductor region of the same type as said first region adjacent said second region with a second semiconductor junction therebetween, said first region being provided therein with a potential barrier having energy higher than that of minority carriers injected from the second region to the first region at the position facing said first junction and apart from the same by a distance smaller than a diffusion distance of the minority carriers, and first, second and third terminals led from said first, second and third regions, respectively, said first and third terminals being connected to connection points between said switching means and said signal input means of both of said current paths, respectively, and e. signal output means connected to said second terminal of said semiconductor device for deriving therefrom a signal supplied through said signal input means in accordance with the switching operation of said switching means.

2. A switching circuit according to claim 1, wherein each of said switching means comprises a switching transistor with a collector-emitter path connected between said signal input means and said common current sink and a base connected to said switching signal supplying means.

3. A switching circuit according to claim 2, wherein each of said signal input means comprises an input transistor with a collector-emitter path connected in series to the collector-emitter path of said switching transistor and a base connected to be supplied with an input signal.

4. A switching circuit according to claim 3, wherein said signal output means comprises a load impedance connecting between said second terminal of the semiconductor device and an operating voltage source.

5. A switching circuit according to claim 4, wherein the bases of said input transistors are supplied with different input signals, respectively.

6. A switching circuit according to claim 4, wherein the bases of said input transistors are supplied with the same input signal differentially.

7. A switching circuit according to claim 4, wherein said switching and input transistors are said semiconductor devices.

8. A switching circuit according to claim 1, wherein said first and third regions of the semiconductor device have the impurity concentration in substantially the same order and said first region is provided therein a portion having the impurity concentration higher than other portions of the first region at the position apart from said first junction by a distance smaller than the diffusion distance of the minority carriers to make said potential barrier.

9. A switching circuit according to claim 1, wherein said first and third regions of the semiconductor device have the impurity concentration in substantially the same order and an additional semiconductor region of the same type as said second region is provided in said first region at the position apart from said first junction by a distance smaller than the diffusion distance of the minority carriers to make said potential barrier.

10. A switching circuit comprising:

a. first and second current paths each formed by a series connection of a switching means and signal input means;

b. a current sink connected in common to one end of both of said first and second current paths;

c. means for differentially supplying a switching signal to both said switching means of the first and second current paths to cause them to switch alternately;

d. a semiconductor device comprising a first semiconductor region of one conductivity type having a predetermined impurity concentration, a second semiconductor region of the opposite conductivity type having a predetermined impurity concentration interfaced with said first region and forming a first semiconductor PN junction with said first region, a third semiconductor region of the same conductivity type as said first region having a predetermined impurity concentration interfaced with said second region at a point spaced from said first junction and forming a second PN semiconductor junction with said second region, a fourth semiconductor region of the same conductivity type as said first region interfaced with said first region having a predetermined impurity concentration substantially higher than that of said first region and spaced from said first PN junction by a distance smaller than the diffusion length of minority carriers injected into said first region from said second region when said first PN junction is forwardly biased, said first and fourth regions forming a first low-high impurity concentration semiconductor junction at their interface, a fifth semiconductor region of the same conductivity type as said third region interfaced with said third region, having a predetermined impurity concentration substantially higher than that of said third region and spaced from said second PN junction by a distance smaller than the diffusion length of minority carriers injected into said third region from said second region when said second PN junction is forwardly biased, said third and fifth regions forming a second low-high impurity concentration semiconductor junction at their interface, the difference in impurity concentrations on opposite sides of each of said first and second low-high impurity concentration semiconductor junctions being selected to provide an energy barrier higher than the energy level of said injected minority carriers reaching said low-high impurity concentration junctions from said second region;

e. first, second and third terminals led from said first, second and third regions, respectively, said first and third terminals being connected to first and second connection points between said switching means and said signal input means of each of said first and second current paths, respectively; and f. signal output means connected to said second terminal of said semiconductor device for deriving therefrom a signal supplied through said signal input means in accordance with the switching operation of said switching means.

11. A switching circuit according to claim 10, in which said first and second potential barriers are spaced substantially the same distance from the first and second junctions, respectively.

* * * * *